United States Patent [19]
Hiramatsu

[11] Patent Number: 5,778,031
[45] Date of Patent: Jul. 7, 1998

[54] DECODING CIRCUIT FOR BI-PHASE BPSK SIGNAL HAVING A HIGH NOISE IMMUNITY

[75] Inventor: Tatsuo Hiramatsu, Osaka, Japan

[73] Assignee: Sanyo Electric Co., Ltd., Osaka, Japan

[21] Appl. No.: 505,977

[22] Filed: Jul. 24, 1995

[30] Foreign Application Priority Data

Jul. 25, 1994 [JP] Japan ..................... 6-172682
Aug. 29, 1994 [JP] Japan ..................... 6-203731

[51] Int. Cl.$^6$ ............... H03D 3/22; H03D 3/18; H04L 7/02
[52] U.S. Cl. .......................... 375/333; 375/361
[58] Field of Search .................. 375/324, 329, 375/282, 332, 333, 361, 360

[56] References Cited

U.S. PATENT DOCUMENTS 4,302,845 11/1981 McClaughry et al. ............ 375/328
4,881,059 11/1989 Saltzberg ............................ 341/70

Primary Examiner—Chi H. Pham
Assistant Examiner—William Luther
Attorney, Agent, or Firm—Nikaido, Marmelstein, Murray & Oram LLP

[57] ABSTRACT

A bi-phase signal is output from BPSK demodulator; by a pair determining circuit and a clock reproducing circuit, a clock signal corresponding to a former half bit of two half bits constituting a data pair of the bi-phase signal is reproduced; a carrier pulse immediately following the clock signal is generated by a carrier extracting circuit; using the carrier pulse and a carrier pulse obtained by delaying the pulse signal by a half bit period as a sampling clock, the bi-phase signal is subjected to AD conversion by AD converting circuit; two AD converted data values different in time are input to a subtraction circuit, and a result of subtraction between data pairs of bi-phase signals is obtained; thus sign of a bi-phase signal is determined.

10 Claims, 8 Drawing Sheets

5,778,031

1

DECODING CIRCUIT FOR BI-PHASE BPSK SIGNAL HAVING A HIGH NOISE IMMUNITY

BACKGROUND OF THE INVENTION

1. Field of the Invention

The present invention relates to a circuit for decoding bi-phase BPSK signals. More specifically, the present invention relates to a decoding circuit for decoding bi-phase BPSK signals in RDS (Radio Data System) and RBDS (Radio Broad-cast Data System).

2. Description of the Background Art

In the RDS and RBS broadcast, data is transmitted frequency-multiplexed on FM broadcast wave. Bi-phase BPSK signals are used for the data. The bi-phase BPSK signal represents "1" by "10" and "0" by "01", as shown in FIG. 1.

FIG. 2 shows a block diagram of a conventional RDS receiver for which said bi-phase BPSK signals are used. Referring to FIG. 2, an FM tuner 12 receives radiowave of FM broadcast through an antenna 11, converts the received radiowave to an intermediate frequency signal, and applies the converted signal to a stereophonic demodulating circuit 13. Stereophonic demodulating circuit 13 demodulates the intermediate frequency signal, generates left and right audio signals, and applies the generated signals to a power amplifying circuit 14. Power amplifying circuit 14 amplifies the left and right audio signals, and drives speakers 15 and 16.

Meanwhile, a BPSK signal is input from FM tuner 12 to an RDS demodulating circuit 17 and subjected to BPSK demodulation, while a bi-phase signal is applied to a block synchronization, error detection and correction circuit 18, in which it is subjected to block synchronization, error detection and correction. It is further subjected to RDS data processing in an RDS data processing circuit 19, and characters are represented on a display portion 21. Further, necessary data is input through a keyboard 20 to RDS data processing circuit 19.

FIG. 3 is a block diagram showing the bi-phase BPSK signal decoding circuit included in the RDS demodulating circuit shown in FIG. 2, and FIG. 4 is a time chart showing operations of various portions of FIG. 3.

Referring to FIG. 3, the bi-phase BPSK signal is input to BPSK demodulator 1, and a bi-phase signal shown in FIG. 4(a) is output from BPSK demodulator 1. The bi-phase signal a is applied to a clock reproducing circuit 2, and a clock signal b such as shown in FIG. 4(b) is reproduced.

Further, the bi-phase signal output from BPSK demodulator 1 is successively input to a shift register 31 included in a pair determining circuit 3. Further, the clock signal b reproduced by clock reproducing circuit 2 is applied and delayed by a delay circuit 37 included in fair determining circuit 3. The delay time is set shorter than the period of the clock signal shown in FIG. 4(c). The clock signal c delayed by delay circuit 37 is applied to a shift register 31 and a hexagonal counter 38 in pair determining circuit 3, an LSB output from hexagonal counter 38 is applied to a B input of a selector 39, and the LSB output is inverted by an invertor 30 and input to an A input of selector 39.

Shift register 31 applies continuous three half bits of the successively input bi-phase signal a to EXNOR gate 32 and EXOR gate 33, in which every two bits are compared with each other. An output from EXOR gate 32 is applied to one input end of an AND gate 34 and to one input end of an NOR gate 35, while an output from EXOR gate 33 is applied to

2 the other input end of AND gate 34 and to the other input end of NOR gate 35. Of the half bits a0, a1 and a2 in shift register 31, when a0 and a1 are the same, the output from EXOR gate 32 attains to "1", and when half bits a1 and a2 are different from each other, the output from EXOR gate 33 also attains to "1", and hence the output from AND gate 34 attains to "1".

The output from AND gate 34 is applied to a reset input end of an RS flipflop 36, while the output from NOR gate 35 is applied to a set input end of RS flipflop 36. Therefore, RS flipflop 36 is reset by the output from AND gate 34, of which output attains to "0", determining that the half bit data a1 and a2 constitute a pair. The output from flipflop 36 is applied as a selecting signal to a selector 39. Selector 39 is selected by an output from RS flipflop 36, and selects the LSB output from hexagonal counter 38.

By contrast, when half bit data a0 and a1 are different from each other, the output from EXOR gate 32 attains to "0" and if half bits a1 and a2 are the same, the output from EXOR gate 33 also attains to "0", and thus the output from NOR gate 35 attains to "1". Consequently, RS flipflop 36 is set, the output of which attains to "0", and it is determined that half bit data a0 and a1 constitute a pair. Thus, by selector 39, inverted output from hexagonal counter 38 is selected. Accordingly, a pair determining output which assumes "1" in the former half bit a0 and assumes "0" in the latter half bit a1 of the paired half bit data a0 and a1, such as shown in FIG. 4(d) is provided from selector 39. The bi-phase signal a output from BPSK demodulator 1 is integrated by an integrating circuit 4. Integrating circuit 4 includes two operational amplifiers 47 and 48 connected in series, a capacitor 49 connected between the input and the output of operational amplifier 47, a switch circuit 53 connected to the input side of operational amplifier 47, and a switch circuit 54 connected to both ends of capacitor 49. An output b from clock reproducing circuit 2 and an output d from pair determining circuit 3 are input to an AND gate 5; by the output of which, the switch circuit 54 operates and is reset in integrating circuit 4; the output b from clock reproducing circuit 2 and an inverted signal of output d of pair determining circuit 3 are input to an AND gate 6, and its output is applied as a stop signal to switch circuit 53 of integrating circuit 4. Under the control by switch circuits 53 and 54, if the bi-phase signal a output from BPSK demodulator 1 is "10" as shown in FIG. 4(g), integration in the positive direction takes place, and if it is "01", integration in the negative direction takes place. Therefore, it is determined that the sign of the bi-phase signal is "1" provided that the output from integrating circuit 4 is positive, and it is determined that the sign of the bi-phase signal is "0" if the output is negative.

In this manner, the method of decoding a bi-phase signal using an integrating circuit 4 is advantageous in that even demodulation data in which DC noise is mixed can be decoded and that it has high capability of removing noise.

However, in the decoding circuit shown in FIG. 3, a capacitor 43 is used in the integrating circuit 4. Therefore, a capacitor having a large capacitance is necessary, which hinders higher degree of integration.

Further, pair determining circuit 3 shown in FIG. 3 is disadvantageous since determination as to which half bits constitute a pair becomes impossible when half bits a0, a1 and a2 of "101" for example is input because of noise to shift register 31.

SUMMARY OF THE INVENTION

Therefore, an object of the present invention is to provide a circuit for decoding bi-phase BPSK signal which is not employing a capacitor and is highly immune to noises.

Another object of the present invention is to provide a decoding circuit having a bi-phase signal pair determining circuit which enables determination at high speed and which is highly immune to noises.

Briefly stated, in the present invention, of continuous three half bits (ai, ai+1, ai+2), ai and ai+1 are compared with each other and ai+1 and ai+2 are compared with each other, so as to determine half bits to be paired. When the number of detection of a different pair different from the former pair ai and ai+1 and the latter pair ai+1 and ai+2 of the half bits increases and exceeds a predetermined threshold value, the different pair is determined to be a new pair.

Therefore, according to the present invention, when data pair of bi-phase signals is to be determined, pair determination is performed on the basis of three bits unit. This enables determination at high speed, and makes the circuit less susceptible to noise because of malfunction protection. Accordingly, reliability of pair determination can be improved.

According to another aspect of the present invention, a bi-phase BPSK signal is demodulated by the BPSK demodulating circuit, a clock signal corresponding to a half bit of the bi-phase BPSK signal is reproduced, a clock signal corresponding to one of the half bits constituting a data pair of the bi-phase signal is extracted, a carrier pulse succeeding in time the extracted clock signal is extracted and delayed by the period of half bit, the bi-phase signal output is converted to a digital signal using the carrier pulse and the delayed carrier output as a sampling clock signal, and subtraction between converted two data values different in time is performed. Therefore, according to the present invention, the decoding circuit does not employ a capacitor, so that it is convenient for integration. Further, the decoding circuit is highly immune to noise and capable of removing even such noise that have the same frequency as the input carrier frequency. Therefore, the decoding circuit can be made compact while reliability of the circuit can be improved.

In a preferred embodiment, in order to determine a new pair, an updown counter is operated in response to a pair determination output, the count output from the updown counter is compared with a predetermined threshold value, and control is performed so that the count value of the updown counter does not exceed the number of detection of different pairs. Further, in a preferred embodiment, three continuous half bits of the bi-phase BPSK signals are shifted by a shift register, an exclusive OR of outputs from the first and second stages of the shift register and an exclusive OR of the outputs from the second and third stages of the shift register are calculated, and the half bits are compared.

In a more preferred embodiment, when the count output from the updown counter is not larger than a first value, a signal is output from a first comparing circuit and if the count output from the updown counter is not smaller than a second value, a signal is output from a second comparing circuit, count up of the updown counter is inhibited in response to an output from the first comparing circuit and the countdown of the updown counter is inhibited in response to an output from the second comparing circuit.

In a more preferred embodiment, clock signal is counted by means of 3n-ary counter. When the count value of the updown counter is smaller than a third value, least significant bit of 3n-ary counter is selected in response to a comparing signal from a third comparing circuit, and when the count value is larger than the third value, a signal which is an inversion of the least significant bit of the 3n-ary counter is output.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 5:
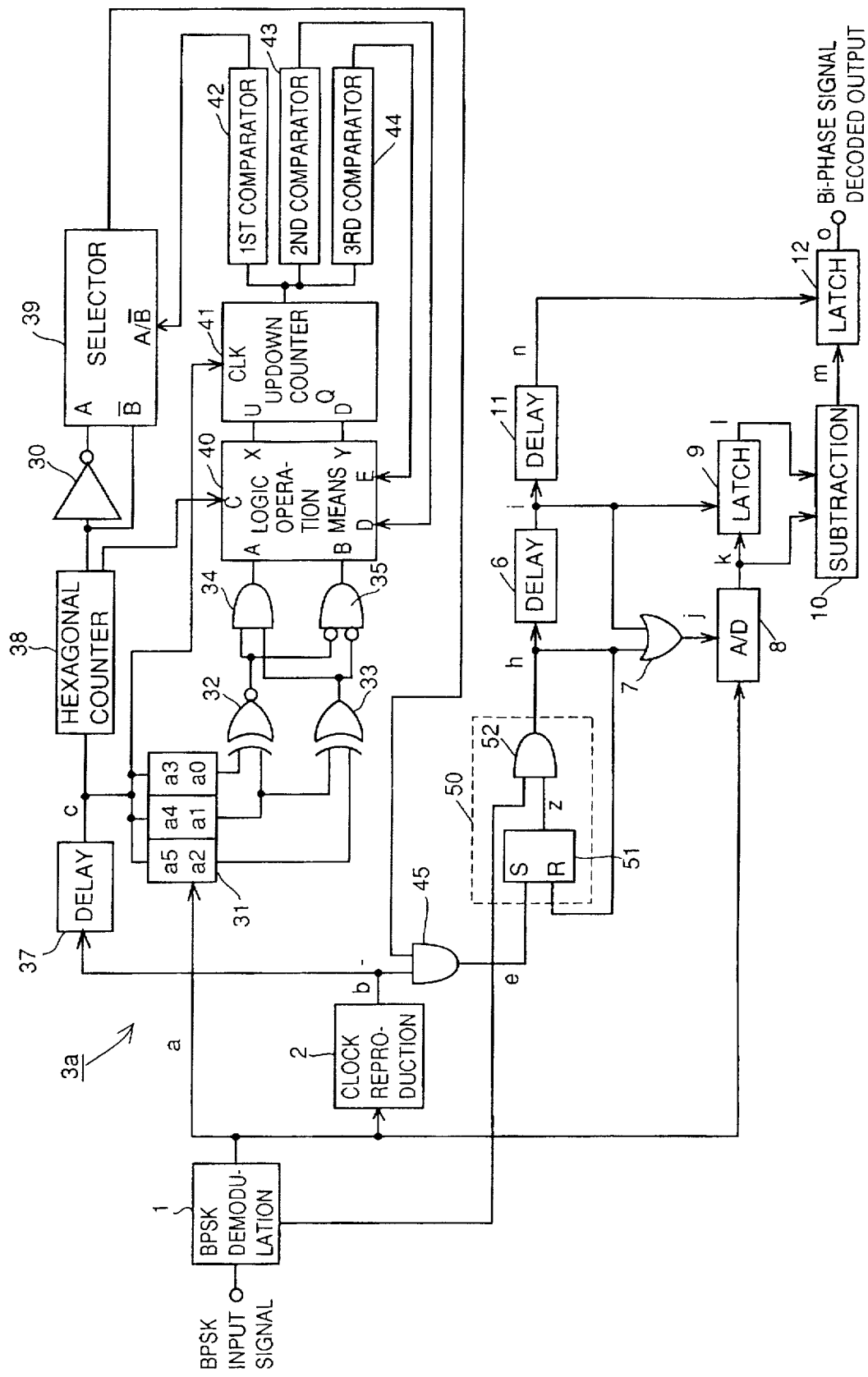
FIG. 5 is a block diagram showing a circuit for decoding bi-phase BPSK signal in accordance with an embodiment of the present invention.

FIG. 5 is a block diagram showing a circuit for decoding bi-phase BPSK signal in accordance with a first embodiment of the present invention.

Figure 1:
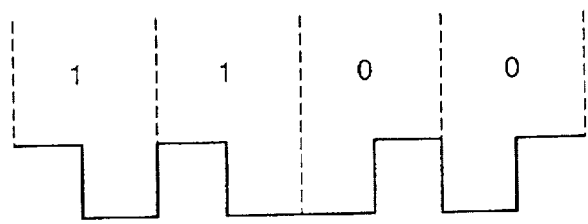
FIG. 1 shows a bi-phase signal.
Figure 2:
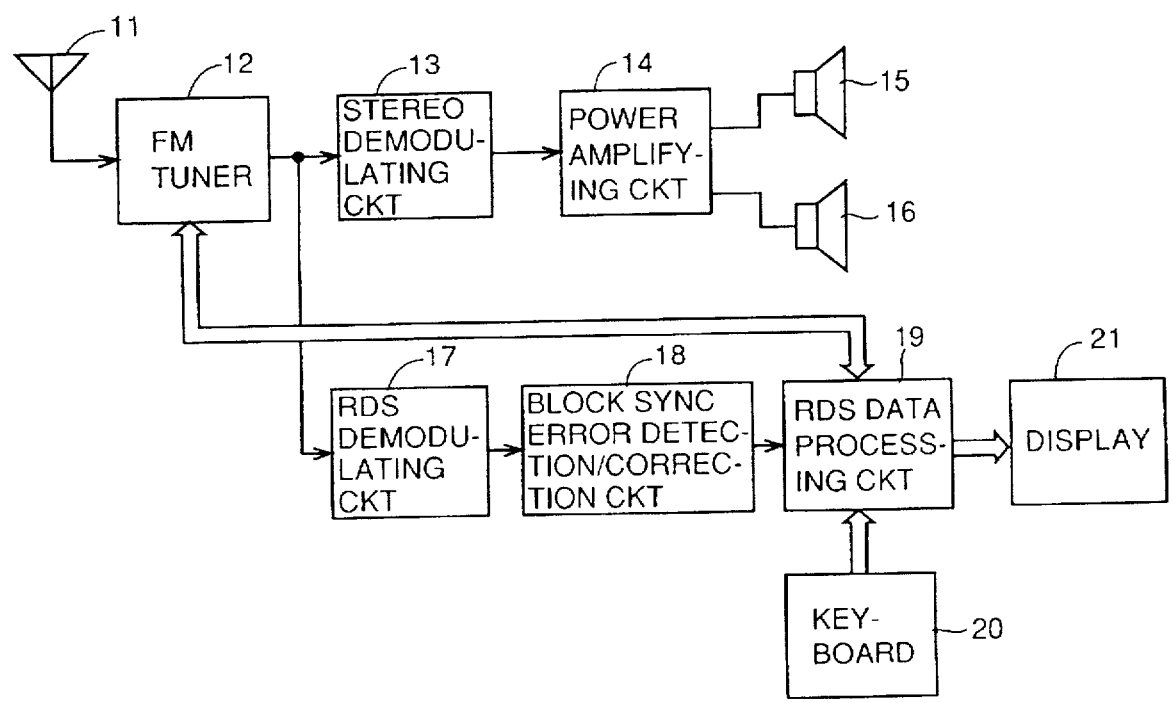
FIG. 2 is a schematic block diagram of a conventional RDS receiver.
Figure 3:
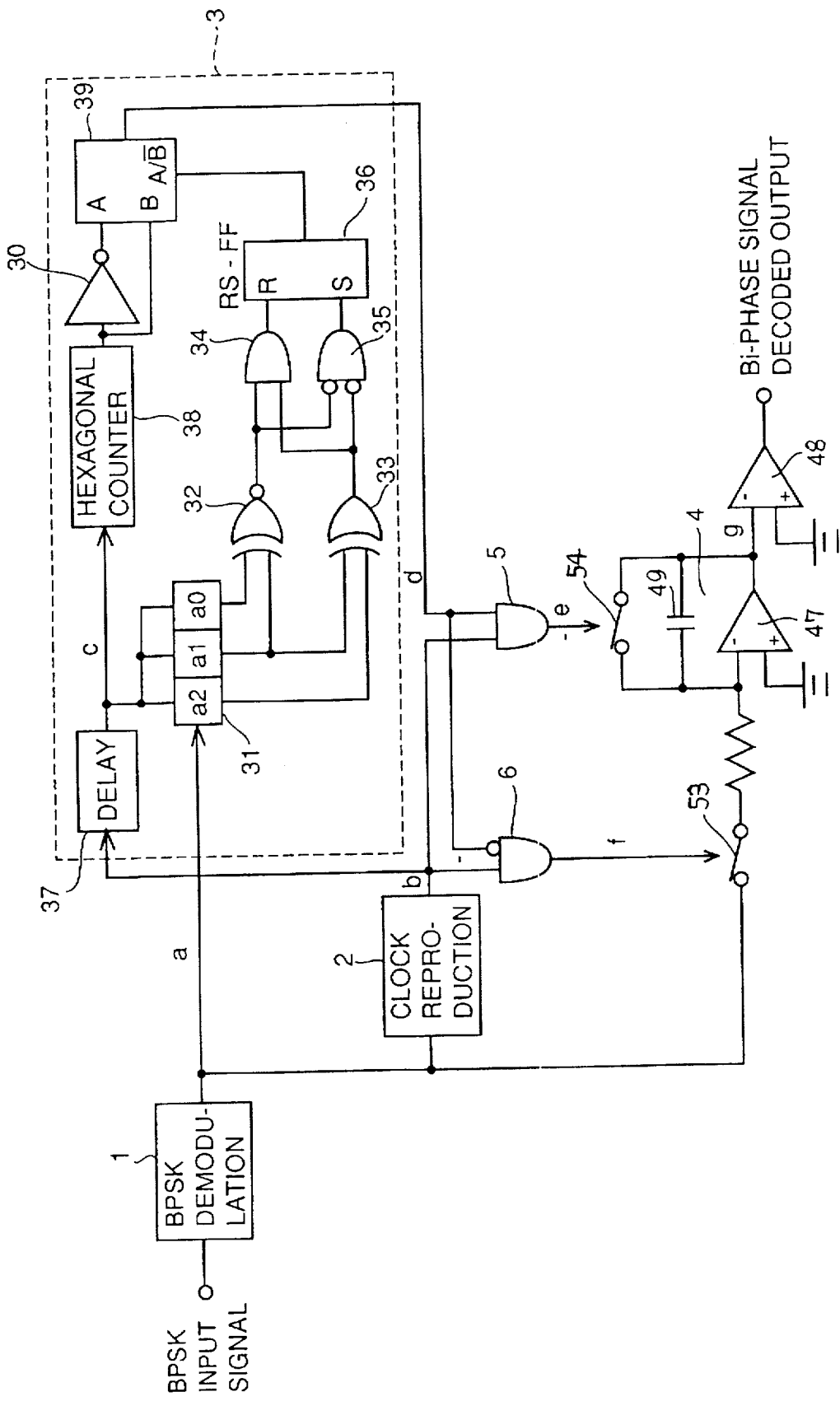
FIG. 3 is a block diagram showing a conventional circuit for decoding bi-phase BPSK signal.
Figure 4:
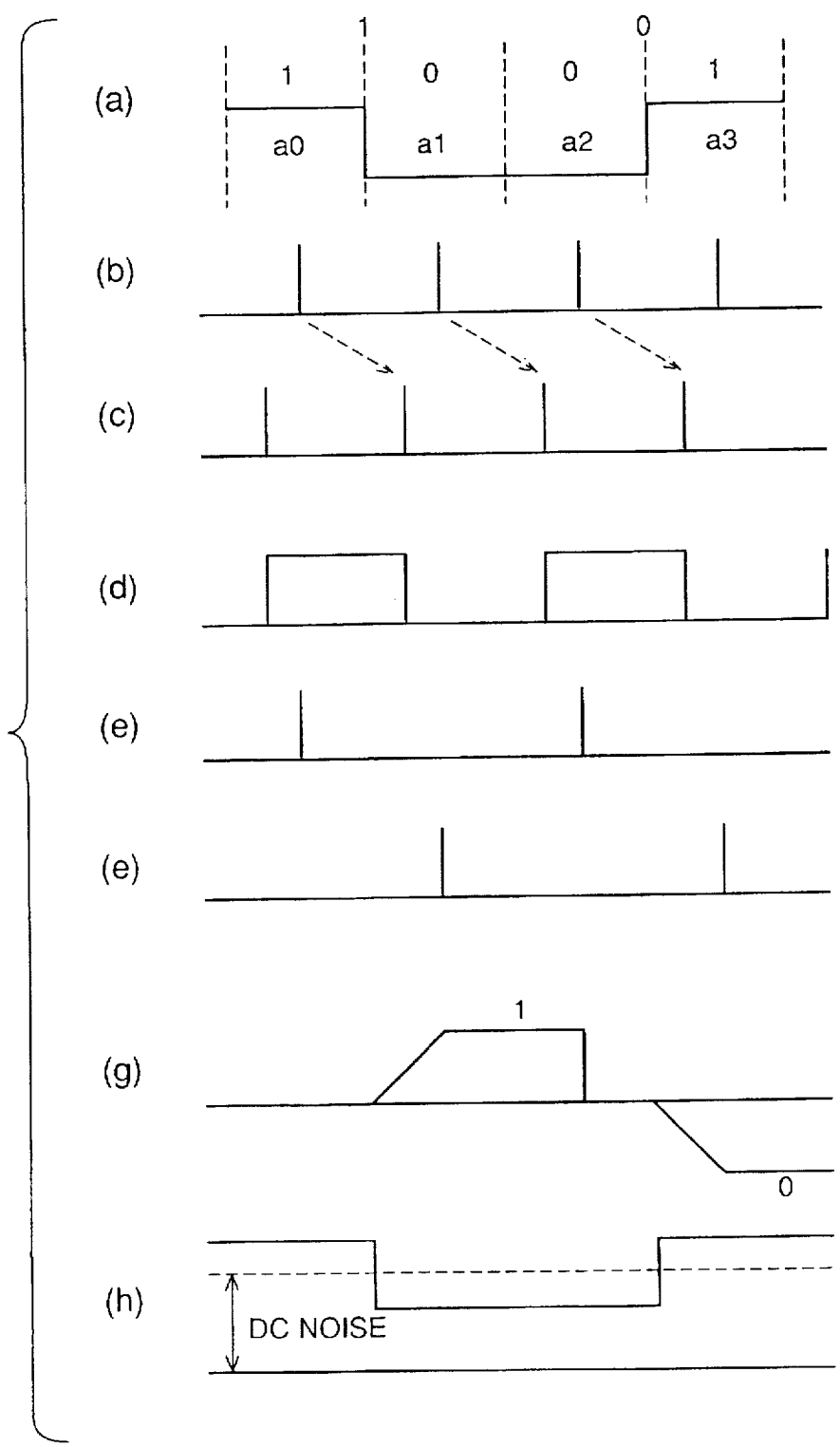
FIG. 4 is a time chart showing operations of various portions of the circuit for decoding bi-phase BPSK signal shown in FIG. 3.

Referring to FIG. 5, BPSK demodulator 1, clock reproducing circuit 2, and shift register 31, EXOR gate 32, EXOR gate 33, AND gate 34, NOR gate 35, delay circuit 37, hexagonal counter 38, invertor 30 and selector 39 included in pair determining circuit 3a, are structured in the similar manner as in the prior art example shown in FIG. 3.

In the present embodiment, in order to determine pairs of half bits, a logic operation circuit 40, an qpdown counter 41 and first to third comparators 42, 43, and 44 are provided in pair determining circuit 3a. Logic operation circuit 40 receives count output from hexagonal counter (3n-ary counter) 38 as its C input, an output from AND gate 34 as its A input, an output from NOR gate 35 as its B input, an output from second comparator 43 as its D input, and an output from third comparator 44 as its E input. For these inputs, logic operation circuit 40 carries out operations for calculating outputs X and Y represented by the following equations.

$$X = ((C=2) \cdot B + (C=5) \cdot A) \cdot D \tag{1}$$

$$Y = ((C=2) \cdot A + (C=5) \cdot B) \cdot E \tag{2}$$

The outputs X and Y of the operation are applied to updown counter 41. Updown counter 41 has the clock signal delayed by delay circuit 37 as its count input, and when an output X from logic operation circuit 40 is input, it counts up, while it counts down when output Y is input. The count output from updown counter 41 is applied to the first, second and third comparators 42, 43 and 44. First comparator 42 controls selector 39 such that when the count output from updown counter 41 is not smaller than a prescribed threshold value α1 (≧α1), selector 39 selects an output from invertor 30. When the count output from updown counter 41 is not higher than a prescribed threshold value α2 (≦α2), second comparator 43 provides a 1) input to logic operation circuit 40. When the count output from updown counter 41 is not smaller than a prescribed threshold value α3 (≧α3), third comparator 44 provides an E input to logic operation circuit 40.

Logic operation circuit 40, updown counter 41 and first to third comparators 42 to 44 constitute malfunction preventing means.

The output signal from selector 3 and the clock signal from clock reproducing circuit 2 are input to AND gate 45, and from AND gate 45, a clock signal corresponding to a former half bit of the data pair is output. This signal will be a set input of the RS flipflop 51 in a carrier extracting circuit 50, an output signal from RS flipflop 51 and a carrier output from BPSK demodulator 1 are input to an AND gate 52, an output signal from AND gate 52 will be a carrier pulse immediately succeeding the clock signal to be applied to a reset input end of RS flipflop 51 as well as to delay circuit 6, and a pulse which is delayed by a half bit period is obtained from the delay circuit 6. The pulse signal and the output pulse from carrier extracting circuit 50 are input to OR gate 7, and the output signal from OR gate 7 is applied, as a sampling clock signal, to A/D converting circuit 8. By this sampling clock signal, bi-phase signal output from BPSK demodulator 1 is Converted to a digital signal, which is latched by a latch circuit 9 at the output of delay circuit 6, and applied to a subtraction circuit 10. The data latched in latch circuit 9 is also applied to subtraction circuit 10, and subtraction between half bits of the bi-phase pair is performed by subtracting circuit 10. An output from subtracting circuit 10 is applied to latch circuit 12, and latched in latch circuit 12 by a signal obtained by further delaying the output from delay circuit 6, by delay circuit 11.

Figure 6:
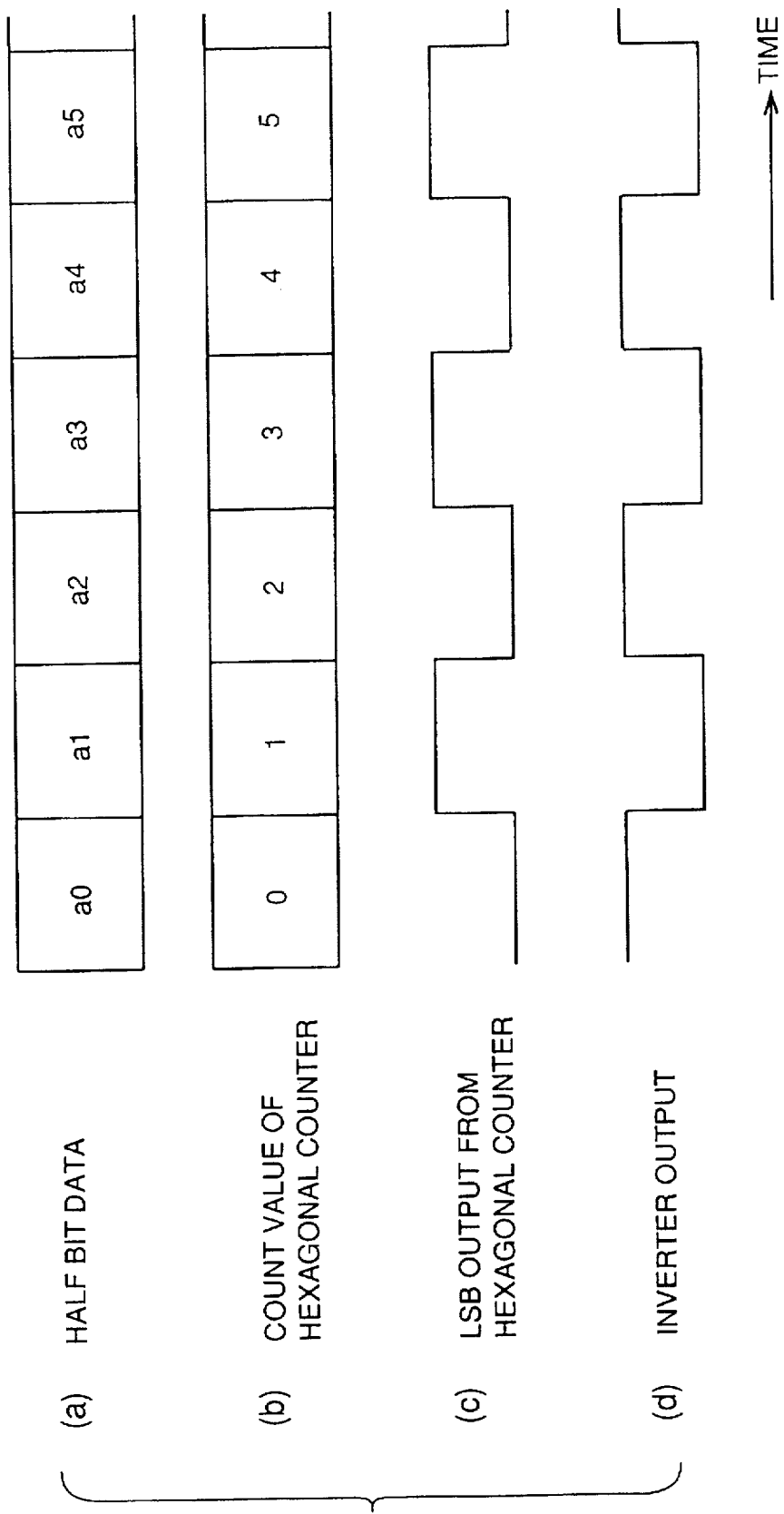
FIG. 6 is a time chart showing operation of a pair determining circuit included in the decoding circuit shown in FIG. 5.
Figure 7:
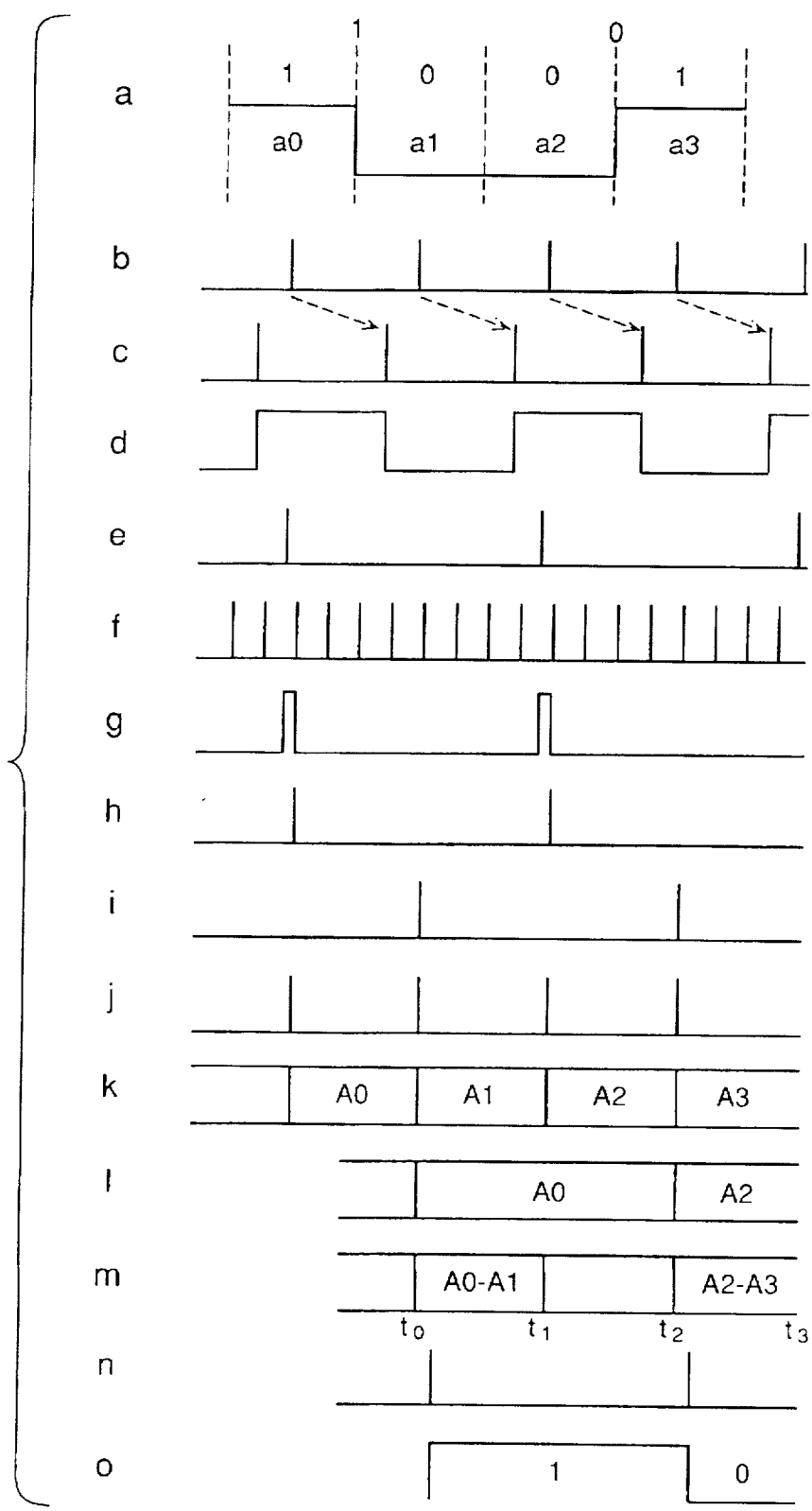
FIG. 7 is a time chart showing the operation of the decoding circuit shown in FIG. 5.

FIG. 6 is a time chart showing the operation of the pair determining circuit 3a shown in FIG. 5, and FIG. 7 is a time chart showing the operation of various portions of the decoding circuit shown in FIG. 5.

The operation of the decoding circuit shown in FIG. 5 will be described with reference to FIGS. 6 and 7. As shown in FIG. 6(a), half bit data of the bi-phase signals are input in order starting from a0, to shift register 31, from BPSK demodulator 1. At this time, the count value of hexagonal counter 38 assumes the value shown in FIG. 6(b). The LSB output from hexagonal counter 38 is as shown in FIG. 6(c), and the output from invertor 30 is the signal shown in FIG. 6(d).

Pair determining circuit 3a performs pair determination at every three continuous half bits, that is, when the count value of hexagonal counter 38 is "2" and "5". The output of hexagonal counter 38 of "2" corresponds to a state in which former three bits a0 to a2 are successively in the shift register 31 starting from a0, the count value of hexagonal counter 38 being "2". As already described with reference to FIG. 3, of the three bits, if a0 and a1 differ from each other, the output of EXNOR gate 32 attains to "0", and if a1 and a2 are the same, the output from EXOR gate 35 also attains to "0", the output from AND gate 34 attains to "0" and the output from NOR gate 35 attains "1" which are used as inputs A and B of logic operation circuit 40.

Here, if the second and third comparators 43 and 44 were not provided, then the outputs X and Y of logic operation circuit 40 would be X=1 and Y=0 from the equations (1) and (2) above. Therefore, updown counter 41 counts up by 1. The count output from hexagonal counter 38 of 5 corresponds to a state in which latter three bits a3 to a5 are in shift register 31 in order starting from a3, and the count value from hexagonal counter 38 is 5. As already described with reference to FIG. 3, of the three bits mentioned above, if a3 and a4 are the same, the output from EXOR gate 32 would be "1", and if a4 differs from a5, the output from EXOR gate 33 would also be "11", the output from AND gate 34 would be "1" and the output prom NOR gate 35 would be "0", which serve as inputs A and B of logic operation circuit 40.

Here, if the second and third comparators 43 and 44 were not provided, the outputs X and Y of logic operation circuit 40 would be X=1, Y=0 based on the equations (1) and (2). Therefore, in this case also, updown counter 41 counts up by 1.

However, if X=1 and Y=1 were continuously output thereafter, the updown counter 41 would be count up indefinitely. Therefore, logic operation circuit 40 limits the count up using the D input from the second comparator 43. Assume that a prescribed threshold value a2 of second comparator 43 is 5. Only when the count value of updown counter 41 is not higher than 5, the output from second comparator 43 attains to "1", the output X from logic operation circuit 40 based on the equation (1) attains to "1", and updown counter 41 counts up. Assume that a prescribed threshold value α1 of the first comparator 42 is 1. At this time, the output from first comparator 42 attains to "1", and therefore selector 39 selects and outputs the output (FIG. 6(d)) of invertor 30. Here, of three continuous half bits of the bi-phase signals, the former two are determined to be a pair if the output from selector 39 is "1", and the latter two are determined to be a pair if the output from selector 39 is "0", and therefore in this example, the pairs of the biphase signals are (a0, a1), (a2, a3), (a4, a5) . . . .

Even when X=0 and Y=1 are output from logic operation circuit 40 and updown counter 41 counts up by 1 from some cause, the circuit continuously determines that the pairs are (a0, a1), (a2, a3), (a4, a5) . . . , considering the outputs X–0 and Y=1 as erroneous outputs caused by noise on the 3 bits of data in shift register 31, as far as the count value is larger than the prescribed threshold values α1=1 of the first comparator 42.

Further, if 3 bits of data assumes "010" and the outputs from logic operation circuit 40 are X=0 and Y=0 by some cause, updown counter 41 neither counts up nor counts down. However, as long as the count value is larger than the prescribed threshold value α1=1 of the first comparator 42, the circuit determines that there is error in the three bits of data, and continues to determine the pairs as (a0, a1), (a2, a3), (a4, a5) . . . , similar to the aforementioned example.

Let us consider an example in which three bits of data a0 to a2 are in shift register 31 in this order starting from a0, in which a0 and a1 are the same and a1 and a2 differ from each other. At this time, outputs from EXNOR gate 32 and EXOR gate 33 are both "1", and the output from AND gate 34 is "1", the output from NOR gate 35 is "0", which are the A and B inputs of logic operation circuit 40.

Here, if the second and third comparators 43 and 44 are not provided, the outputs X and Y from logic operation circuit 40 would be X=0 and Y=1 based on the equations (1) and (2) above, and therefore updown counter 41 counts down by 1. Let us consider an example in which three bits of data a3 to a5 are in shift register 31 in this order starting from a3, in which a3 and a4 differ from each other while a4 and a5 are the same. At this time, outputs from EXNOR gate 32 and EXOR gate 35 are both "0", the output from AND gate 34 attains to "0" and the output from NOR gate 35 attains "1", which serve as A and B inputs to logic operation circuit 40.

Here, if the second and third comparators 43 and 44 were not provided, the outputs X and Y from logic operation circuit 40 would be X=0 and Y=1, in this case also, based on the equations (1) and (2) above, and updown counter 41 counts down by 1. However, if the outputs X=0 and Y=1 are continuously output thereafter, the updown counter 41 would be counted down indefinitely, and therefore count down is controlled by the E input from the comparator 44. More specifically, if the prescribed threshold value α3 of the third comparator 44 is set to −4, the output from the third comparator 44 assumes "1" only when the count value of updown counter 41 is not lower than −4, and the output Y from logic operation circuit 40 based on equation (2) attains "1" and updown counter 41 counts down. Since the prescribed threshold value a1 of the first comparator 42 is 1, the output from the first comparator 42 at this time would be "0", and selector 39 selects the LSB output of hexagonal counter 38 and outputs it. Therefore, as already described, when the output from selector 39 is "1", former two of three continuous half bits of the bi-phase signals are determined to be a pair, and latter two are determined to be a pair when the output from selector 39 is "0", and therefore in this case, the pairs of the bi-phase signals are (a1, a2), (a3, a4), (a5, a6).

...

Referring to FIG. 7, the operation for outputting a decoded signal of the bi-phase signal will be described with reference to FIG. 7. As already described, a bi-phase signal such as shown in FIG. 7(a) is output from BPSK demodulator 1, and clock reproducing circuit 2 reproduces a clock signal such as shown in FIG. 7(b) utilizing the bi-phase signal. Meanwhile, a pair determination output is provided from selector 39, which output assumes "1" when former two half bits among three hold bit data a0, a1 and a2 in shift register 31 of pair determining circuit 3a constitute a pair, and assumes "0" when the pair is constituted by the latter two half bits. This determination output and the clock signal are input to AND gate 45, and a clock signal corresponding to the former half bits of the data pair is output as shown in FIG. 7(e). By this output from AND gate 45, RS flipflop 51 is set. This set output and a carrier output such as shown in FIG. 7(f) from BPSK demodulator 1 are input to AND gate 52, and RS flipflop 51 is reset by the output from AND gate 52. As an output from AND gate 52, a carrier pulse such as shown in FIG. 7(h) is obtained.

The carrier pulse is applied to delay circuit 6, and by the delay circuit 6, a pulse which is delayed by a half bit period as shown in FIG. 7(i) is generated. This pulse and an output pulse from a carrier extracting circuit 50 are input to an OR gate 7. From the output of OR gate 7, such a sampling clock signal as shown in FIG. 7(j) is output and applied to AD converting circuit 8. According to the sampling clock signal, bi-phase signal outputs from BPSK demodulator 1 are subjected to A/D conversion, resulting in digital data such as shown in FIG. 7(k). The data is latched by a latch circuit 9 of which latch pulse is the output from delay circuit 6. The latched data shown in FIG. 7(l) and the output data from AD converting circuit 8 are input to subtraction circuit 10, and results of operation between half bits of the bi-phase pairs are obtained at time periods t0 to t1 and t2 to t3 shown in FIG. 7(m).

At this time, if the bi-phase signal output from BPSK demodulator 1 is "01", the result of subtraction of the aforementioned period would be "−1", and the sign is determined to be "0". If the bi-phase signal output from BPSK demodulator 1 is "10", the result of subtraction of the above described period would be "1", and the sign is determined to be 1. The determination output from subtraction circuit 10 is latched by a latch circuit 12 of a succeeding stage by a latch pulse shown in FIG. 7(n), which is obtained by further delaying the latch pulse of FIG. 7(i) by delay circuit 11. Thus, finally, decoded data such as shown in FIG. 7(o) is obtained from latch circuit 12.

If the output from subtraction circuit 10 is not based on the subtraction of half bits of the bi-phase pair as in the period t1 to t2 of FIG. 7(m), determination of the sign mentioned above is not performed. The amount of delay provided by the delay circuit 6 is 1/(2B), where B is the bit rate of bi-phase BPSK signal and f represents carrier frequency, since there is a carrier without fail at every time 1/(2B), provided that the following relation $$f/B = 2n$$

holds.

As described above, in the embodiment shown in FIG. 5, the coded data can be obtained without using a capacitor, unlike the prior art. This facilitates integration, realizes high immunity to noise, and allows removal of even such noise that has the same frequency as the input carrier frequency. Therefore, a circuit for decoding bi-phase BPSK signal can be made compact and its reliability can be improved.

Figure 8:
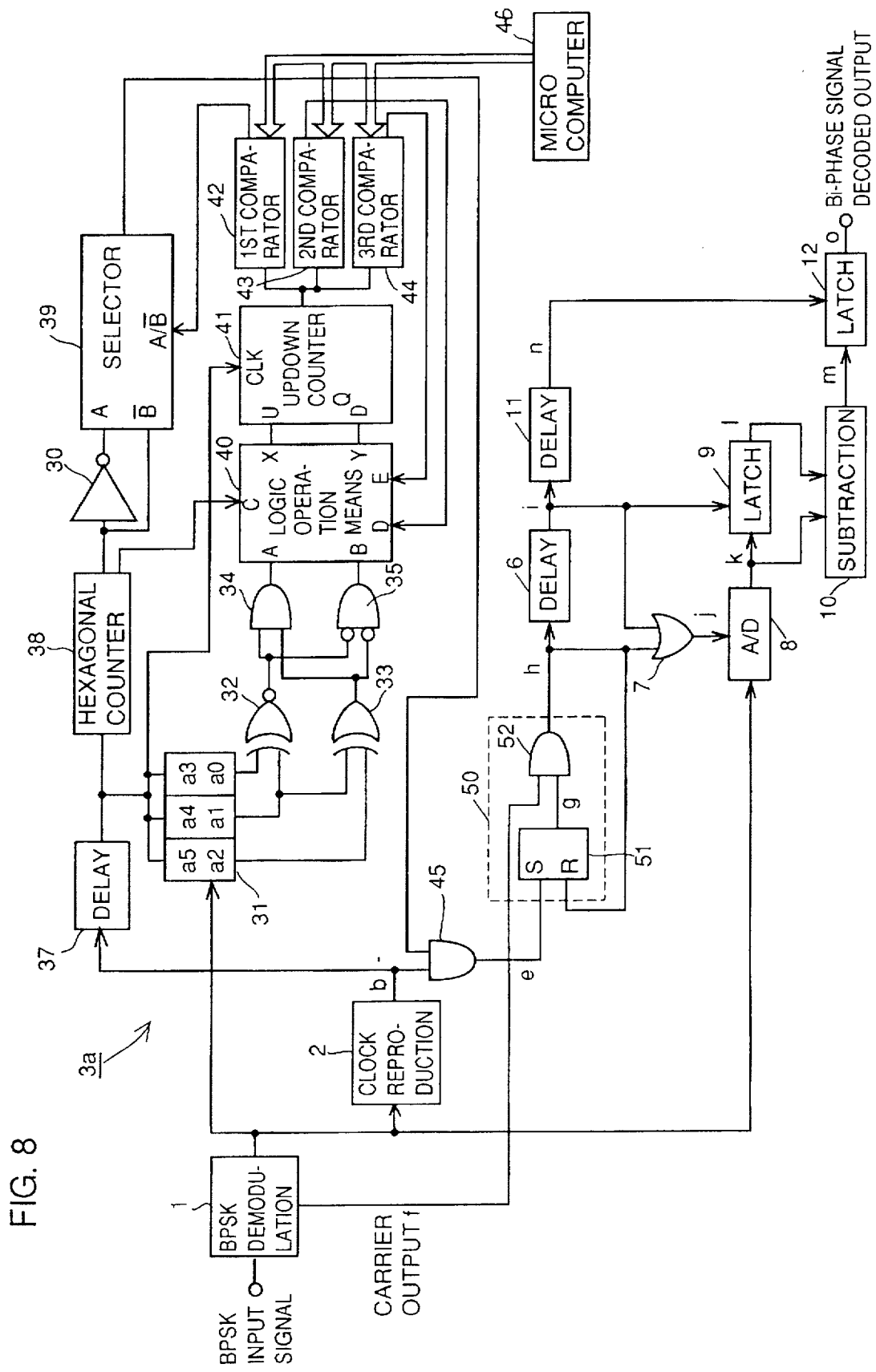
FIG. 8 is a block diagram showing another example of the circuit for decoding bi-phase BPSK signal.

FIG. 8 is a block diagram showing another example of the circuit for decoding bi-phase BPSK signal. In the embodiment shown in FIG. 8, the threshold values of the first, second and third comparators 42, 43 and 44 shown in FIG. 5 are automatically controlled by means of a micro computer 46, in accordance with an error rate of the half bits of the bi-phase signal. The threshold values of first to third comparators 42 to 44 may be automatically controlled by means of a microcomputer 46, in accordance with the receiving intensity of the bi-phase BPSK signal.

Figure 9:
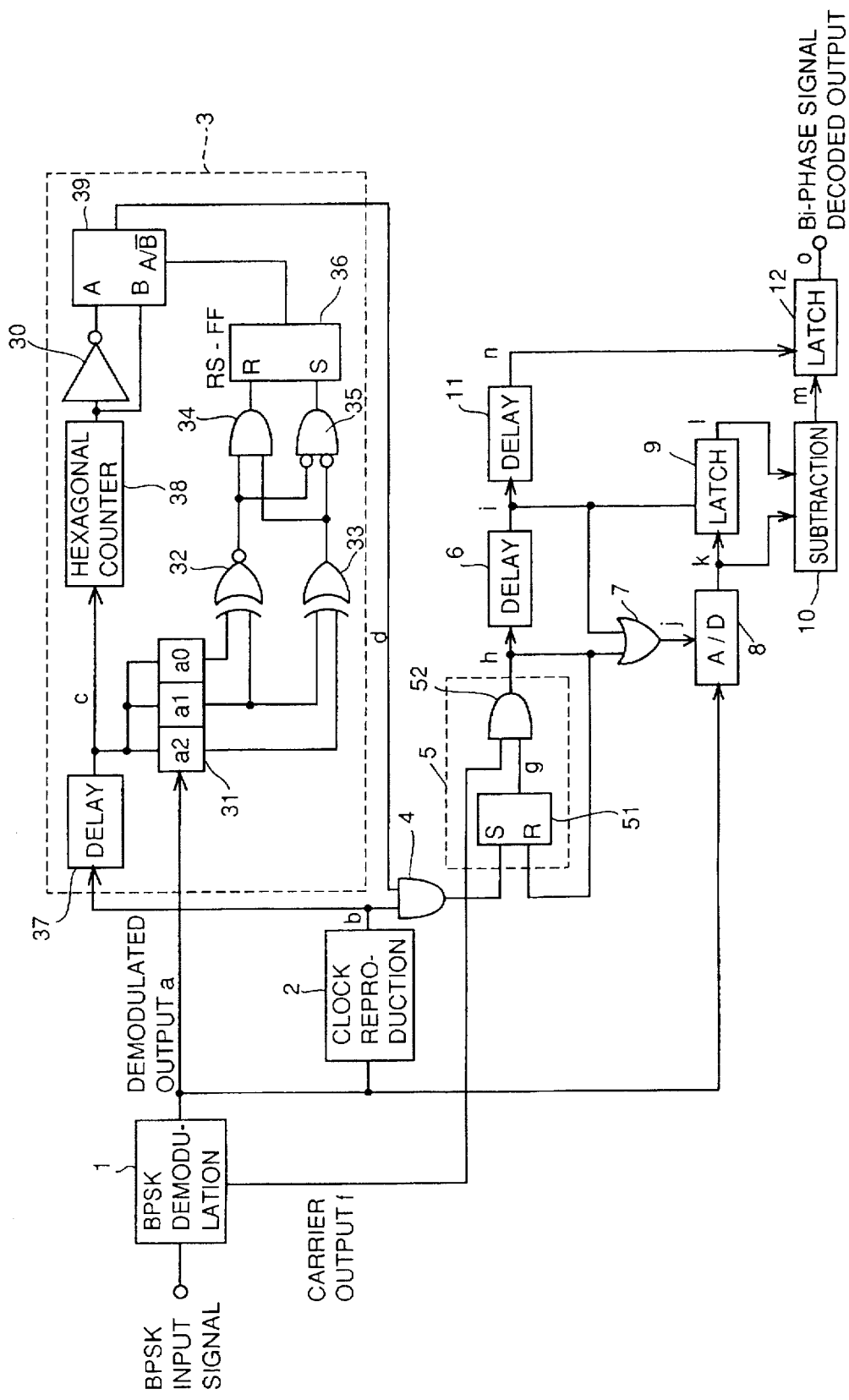
FIG. 9 is a block diagram showing a still another embodiment of the circuit for decoding bi-phase BPSK signal.

FIG. 9 is a block diagram showing a further example of the circuit for decoding bi-phase BPSK signal. In the decoding circuit shown in FIG. 9, in place of the pair determining circuit 3a included in the decoding circuit of FIG. 5, the pair determining circuit 3 shown in FIG. 3 is used. In this embodiment also, the capacitor 43 such as shown in FIG. 3 is not necessary, and therefore it can be integrated easily, and it can be made smaller.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A pair determining circuit for a bi-phase BPSK signal in a decoding circuit, said pair determining circuit comprising:

half bit comparing means for comparing half bits ai with ai+1 and ai+1 with ai+2, wherein said half bit comparing means has an output;

pair determining means connected to said half bit comparing means for determining half bits to be paired based on said output from said half bit comparing means; and malfunction preventing means connected to said pair determining means for detecting a new pair, wherein when a number of pairs ai+1 and ai+2 found to be different from pairs ai and ai+1 exceeds a predetermined threshold value, a detected different pair is determined to be said new pair.

2. A circuit for decoding a bi-phase BPSK signal, comprising:

BPSK demodulating means including carrier reproducing means;

clock reproducing means for reproducing a clock signal corresponding to a half bit of said bi-phase BPSK signal by an output from said BPSK demodulating means;

clock extracting means for extracting a clock signal corresponding to one of the half bits to be paired for the bi-phase signal, from an output of said clock reproducing means;

carrier extracting means for extracting a carrier pulse delayed in time from the clock signal extracted by said clock extracting means;

carrier delay means for delaying an output signal from said carrier extracting means by a half bit period of said bi-phase signal;

converting means for converting the bi-phase signal output from said BPSK demodulating means to a digital data signal, using an output signal from said carrier extracting means and an output signal from said carrier delay means as a sampling clock signal; and subtraction means for performing subtraction between two data values different in time output from said converting means.

3. The circuit for decoding a bi-phase BPSK signal according to claim 2, further comprising:

half bit comparing means for comparing three continuous half bits of bi-phase BPSK signals output from said BPSK demodulating means, ai with ai+1 and ai+1 with ai+2, respectively, wherein said comparing means has an output;

pair determining means connected to said half bit comparing means for determining half bits to be paired, based on comparison output from said half bit comparing means; and malfunction preventing means connected to said pair determining means for detecting a new pair, wherein when a number of pairs ai+1 and ai+2 found to be different from pairs ai and ai+1 exceeds a predetermined threshold value, a detected different pair is determined to be said new pair; wherein said clock extracting means includes gate means for gating the clock signal of the output from said clock reproducing means in accordance with the signal from said malfunction determining means.

4. The circuit for decoding a bi-phase BPSK signal in accordance with claim 1 or 3, wherein said malfunction preventing means includes:

updown counting means having a count output representative of a count value for counting up and down in accordance with determination output from said pair determining means;

comparing means for comparing said count output from said updown counting means with said predetermined threshold value; and logic operation means responsive to comparison output from said comparing means from controlling the count output from said updown counting means so that it does not exceed said number of detection.

5. The circuit for decoding a bi-phase BPSK signal according to claim 4, further comprising register means for shifting three continuous half bits of said bi-phase BPSK signals; wherein said half bits comparing means includes a first exclusive OR gate for obtaining exclusive OR between an output of a first stage and an output of a second stage of said register means, and a second exclusive OR gate for obtaining an exclusive OR between an output of the second stage and an output of a third stage of said register means.

6. The circuit for decoding a bi-phase BPSK signal according to claim 4, further comprising:

clock generating means for generating a clock signal in synchronization with said half bit, wherein said updown counting means counts clock signals from said clock generating means.

7. The circuit for decoding a bi-phase BPSK signal according to claim 4, wherein said comparing means includes first comparing means for outputting a signal when a count output from said updown counting means is not higher than a first value, and second comparing means for outputting said signal when a count output from said updown counting means is not smaller than a second value; and wherein said logic operation means inhibits count up by said updown counting means in response to an output of a signal from said first comparing means, and inhibits count down of said updown counting means in response to said output signal from said second comparing means.

8. The circuit for decoding a bi-phase BPSK signal according to claim 7, further comprising 3n-ary counting means for counting clock signals from clock generating means; wherein said comparing means includes third comparing means for outputting an output signal when said count value from said updown counting means is not smaller than a third value; and said logic operation means includes selective means for selecting a least significant bit of said 3n-ary counting means in response to determination by said third comparing means that the count value of said updown counting means is smaller than the third value, and for outputting a signal obtained by inverting the least significant bit of said 3n-ary counting means, in response to determination that the count value of said updown counting means is larger than the third value.

9. The circuit for decoding a bi-phase BPSK signal according to claim 4, further comprising setting means for variably setting threshold values of said first, second and third comparing means.

10. The circuit for decoding a bi-phase BPSK signal according to claim 2, further comprising latching means for latching data of the digital signal converted by said converting means, wherein said subtraction means subtracts the data latched in said latch means from the data applied to said latch means.

* * * * *